US012660554B2

(12) United States Patent
Ishikawa et al.

(10) Patent No.: US 12,660,554 B2
(45) Date of Patent: Jun. 16, 2026

(54) LAMP HEATING MODULE FOR AN EPITAXY PROCESS CHAMBER

(71) Applicant: Applied Materials, Inc., Santa Clara, CA (US)

(72) Inventors: Tetsuya Ishikawa, San Jose, CA (US); Swaminathan T. Srinivasan, Pleasanton, CA (US); Matthias Bauer, Sunnyvale, CA (US); Ala Moradian, Sunnyvale, CA (US); Manjunath Subbanna, Bangalore (IN); Kartik Bhupendra Shah, Saratoga, CA (US); Kostiantyn Achkasov, Bernin (FR); Errol Antonio C. Sanchez, Tracy, CA (US); Michael R. Rice, Pleasanton, CA (US); Marc Shull, San Jose, CA (US); Ji-Dih Hu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 40 days.

(21) Appl. No.: 17/317,684

(22) Filed: May 11, 2021

(65) Prior Publication Data

US 2022/0367216 A1      Nov. 17, 2022

(51) Int. Cl.
C23C 16/44          (2006.01)
C23C 16/48          (2006.01)
(Continued)

(52) U.S. Cl.
CPC ...... *H10P 72/0602* (2026.01); *C23C 16/4411* (2013.01); *C23C 16/4412* (2013.01); *C23C 16/482* (2013.01); *H10D 48/044* (2025.01)

(58) Field of Classification Search
CPC ......... H01L 21/67115; H01L 21/67109; H01L 21/67103; H01L 21/67248; C30B 25/10; C30B 31/12; C23C 16/481; H05B 3/0047
(Continued)

(56) References Cited

U.S. PATENT DOCUMENTS 3,761,678 A * 9/1973 Eckles .................. H05B 3/009
                                                            392/428
3,984,726 A * 10/1976 Ramler ................. H05B 41/00
                                                            315/297
(Continued)

FOREIGN PATENT DOCUMENTS

CN          103088415 A        5/2013
JP          2001520456 A       10/2001
(Continued)

OTHER PUBLICATIONS

International Search Report and Written Opinion for International Application No. PCT/US2022/025540 dated Aug. 4, 2022.
(Continued)

*Primary Examiner* — Karl Kurple
(74) *Attorney, Agent, or Firm* — Patterson + Sheridan, LLP

(57)          ABSTRACT

The present disclosure generally relates to an epitaxial chamber for processing of semiconductor substrates. In one example, the epitaxial chamber has a chamber body assembly. The chamber body assembly includes a lower window and an upper window, wherein chamber body assembly, the lower window and the upper window enclose an internal volume. A susceptor assembly is disposed in the internal volume. The epitaxial chamber also has a plurality of temperature control elements. The plurality of temperature control elements include one or more of an upper lamp
(Continued)

module, a lower lamp module, an upper heater, a lower heater, or a heated gas passage.

7 Claims, 7 Drawing Sheets

(51) Int. Cl.
| | |
|---|---|
| *H10P 72/00* | (2026.01) |
| *H01L 21/103* | (2006.01) |
| *H01L 21/67* | (2006.01) |
| *H10D 48/044* | (2025.01) |

(58) Field of Classification Search
USPC .......................................... 392/422, 416, 411
See application file for complete search history.

(56) References Cited

U.S. PATENT DOCUMENTS

| | | | | |
|---|---|---|---|---|
| 4,766,091 | A * | 8/1988 | Ohtoshi | H01L 21/0245 |
| | | | | 430/128 |
| 5,156,820 | A | 10/1992 | Wong et al. | |
| 5,970,214 | A * | 10/1999 | Gat | C30B 31/12 |
| | | | | 392/416 |
| 6,301,434 | B1 | 10/2001 | McDiarmid et al. | |
| 7,410,268 | B2 * | 8/2008 | Koren | F21V 29/74 |
| | | | | 362/101 |
| 8,183,132 | B2 | 5/2012 | Nijhawan et al. | |
| 8,491,720 | B2 | 7/2013 | Ishikawa et al. | |
| 8,568,529 | B2 | 10/2013 | Ishikawa et al. | |
| 9,929,027 | B2 | 3/2018 | Ranish et al. | |
| 9,960,059 | B2 * | 5/2018 | Lin | H01L 21/67103 |
| 10,145,011 | B2 | 12/2018 | Abedijaberi et al. | |
| 10,202,707 | B2 * | 2/2019 | Ranish | C30B 25/105 |
| 12,060,651 | B2 * | 8/2024 | Ishikawa | C23C 16/455 |
| 12,091,749 | B2 * | 9/2024 | Ishikawa | C23C 16/46 |
| 2003/0219981 | A1 | 11/2003 | Ammon et al. | |
| 2005/0103261 | A1 | 5/2005 | Von Ammon et al. | |
| 2007/0087533 | A1 | 4/2007 | Nishikawa et al. | |
| 2008/0017116 | A1 | 1/2008 | Campbell et al. | |
| 2008/0187299 | A1 | 8/2008 | Shimizu et al. | |
| 2010/0018960 | A1 * | 1/2010 | Gat | F27B 17/0025 |
| | | | | 219/494 |
| 2010/0092697 | A1 | 4/2010 | Poppe et al. | |
| 2010/0092698 | A1 | 4/2010 | Poppe et al. | |
| 2010/0215872 | A1 | 8/2010 | Sivaramakrishnan et al. | |
| 2010/0258049 | A1 | 10/2010 | Ishikawa et al. | |
| 2010/0258052 | A1 | 10/2010 | Ishikawa et al. | |
| 2010/0261340 | A1 | 10/2010 | Nijhawan et al. | |
| 2010/0263587 | A1 | 10/2010 | Sivaramakrishnan et al. | |
| 2012/0088356 | A1 | 4/2012 | Santhanam et al. | |
| 2013/0256292 | A1 * | 10/2013 | Lin | H05B 3/0047 |
| | | | | 219/250 |
| 2014/0137801 | A1 | 5/2014 | Lau et al. | |
| 2014/0199056 | A1 | 7/2014 | Chang et al. | |
| 2014/0273410 | A1 | 9/2014 | Abedijaberi et al. | |
| 2014/0322897 | A1 | 10/2014 | Samir et al. | |
| 2015/0096973 | A1 | 4/2015 | Dunn et al. | |
| 2015/0147053 | A1 * | 5/2015 | Ranish | H05B 3/0047 |
| | | | | 392/411 |
| 2015/0340257 | A1 * | 11/2015 | Brillhart | H01L 21/67201 |
| | | | | 392/416 |

| | | | | |
|---|---|---|---|---|
| 2016/0056059 | A1 | 2/2016 | Sun et al. | |
| 2016/0289830 | A1 * | 10/2016 | Abedijaberi | C23C 16/52 |
| 2016/0348240 | A1 * | 12/2016 | Burrows | H01L 21/6719 |
| 2017/0103907 | A1 * | 4/2017 | Chu | H01L 21/67115 |
| 2018/0005856 | A1 | 1/2018 | Chang et al. | |
| 2018/0023214 | A1 * | 1/2018 | Lau | C23C 16/46 |
| | | | | 117/88 |
| 2018/0095480 | A1 * | 4/2018 | Bauer | G05D 7/0652 |
| 2018/0209043 | A1 | 7/2018 | Lau et al. | |
| 2018/0240666 | A1 | 8/2018 | Wong et al. | |
| 2019/0067006 | A1 * | 2/2019 | Hawrylchak | H01L 21/68785 |
| 2019/0110336 | A1 | 4/2019 | Cong et al. | |
| 2020/0045776 | A1 * | 2/2020 | Huang | H01L 21/67017 |
| 2020/0071832 | A1 | 3/2020 | Lau et al. | |
| 2020/0091010 | A1 | 3/2020 | Li et al. | |
| 2020/0105554 | A1 | 4/2020 | Hu et al. | |
| 2020/0385866 | A1 | 12/2020 | Srinivasan et al. | |
| 2021/0013055 | A1 | 1/2021 | Schaller et al. | |
| 2021/0189593 | A1 | 6/2021 | Burrows et al. | |
| 2022/0364229 | A1 * | 11/2022 | Ishikawa | C30B 25/16 |
| 2022/0364231 | A1 * | 11/2022 | Ishikawa | C23C 16/45559 |
| 2022/0364261 | A1 * | 11/2022 | Ishikawa | C30B 25/10 |
| 2022/0367216 | A1 * | 11/2022 | Ishikawa | H01L 21/67103 |
| 2024/0209544 | A1 * | 6/2024 | Ishikawa | H01L 21/67742 |
| 2025/0246461 | A1 * | 7/2025 | Ishikawa | C23C 16/4412 |

FOREIGN PATENT DOCUMENTS

| | | |
|---|---|---|
| JP | 2009510262 A | 3/2009 |
| JP | 2015522939 A | 8/2015 |
| JP | 2016111291 A | 6/2016 |
| JP | 2016526279 A | 9/2016 |
| JP | 2016526297 A | 9/2016 |
| JP | 2016530710 A | 9/2016 |
| JP | 2017521874 A | 8/2017 |
| JP | 2018170514 A | 11/2018 |
| JP | 2019009453 A | 1/2019 |
| JP | 2019114699 A | 7/2019 |
| KR | 10-2016-0119791 A | 10/2016 |
| WO | 2018042877 A1 | 3/2018 |

OTHER PUBLICATIONS

International Search Report and Written Opinion dated Aug. 4, 2022 for Application No. PCT/US2022/025772.

International Search Report and Written Opinion for PCT/US2022/026071 dated Aug. 10, 2022.

Office Action for Japanese Application No. 2023-543348 dated Jul. 30, 2024.

Office Action for Japanese Application No. 2023-543392 dated Aug. 6, 2024.

Japanese Office Aciton for Application No. 2023-543395 dated Aug. 6, 2024.

Korean Office Action for Application No. 10-2023-7024873 dated Jun. 20, 2024.

Japanese Office Action for Application No. 2023-543395 dated Feb. 25, 2025.

European Search Report for Application No. 22808027.1 dated Jun. 20, 2025.

Taiwanese Office Action for Application No. 111116929 dated Feb. 26, 2026.

Office Action from South Korean Patent Application No. 10-2025-7014737 dated Mar. 24, 2026.

* cited by examiner

LAMP HEATING MODULE FOR AN EPITAXY PROCESS CHAMBER

BACKGROUND

Field

Embodiments of the present disclosure generally relate to apparatus and methods for fabricating semiconductor devices. More specifically, apparatus disclosed herein relate to an epitaxial deposition chamber having a plurality of temperature control elements.

Description of the Related Art

Semiconductor substrates are processed for a wide variety of applications, including the fabrication of integrated devices and micro devices. One such processing device is an epitaxial processing chamber. During processing, the substrate is positioned on a susceptor within the epitaxial processing chamber. The susceptor is supported by a support shaft, which is rotatable about a central axis. Precise control over a heating source, such as a plurality of heating lamps disposed below and above the substrate, allows the substrate to be heated within very strict tolerances. The temperature of the substrate can affect the uniformity of the material deposited on the substrate.

The ability to precisely control substrate temperatures within the epitaxial processing chamber has a significant impact throughput and production yields. Conventional epitaxial processing chamber have difficulty meeting temperature control criteria needed to fabricate next generation devices, while meeting ever increasing demands for improved production yields and faster throughput.

Therefore, a need exists for improved temperature control in epitaxial processing chambers.

SUMMARY

The present disclosure generally relates to an epitaxial chamber for processing of semiconductor substrates having a plurality of temperature control elements. In one example, an epitaxial chamber has a chamber body assembly. The chamber body assembly includes a lower window and an upper window, wherein chamber body assembly, the lower window and the upper window enclose an internal volume. A susceptor assembly is disposed in the internal volume. The epitaxial chamber also has a plurality of temperature control elements. The plurality of temperature control elements include two or more temperature control elements selected from the group consisting of an upper lamp module, a lower lamp module, an upper heater, a lower heater, and a heated gas passage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to apparatus for semiconductor processing having a plurality of temperature control elements. More specifically, apparatus disclosed herein relate to a process chamber and its components. The process chamber is configured as a thermal deposition chamber, such as an epitaxial deposition chamber. The process chamber has less expensive components compared to conventional chambers, thus reducing the cost for replacement of portions of the process chamber after the portion of the chamber body is worn or when an improved design to a portion of the chamber body is available. The disclosed process chamber overcomes conventional challenges, including improved uniform thermal control with the processing chamber, which enables better throughput with increased process yields.

Also disclosed herein are components of the process chamber that enable improved temperature control. The components that enable improved temperature control include an upper lamp module, a lower lamp module, and one or more heating elements. Each of these temperature control improving process chamber components can be utilized individually, or with one or more other temperature control improving chamber components to control the temperature of the process chamber while processing a substrate by epitaxial deposition which has a substantial and beneficial impact on epitaxial deposition film quality and process through-put.

Figure 1:
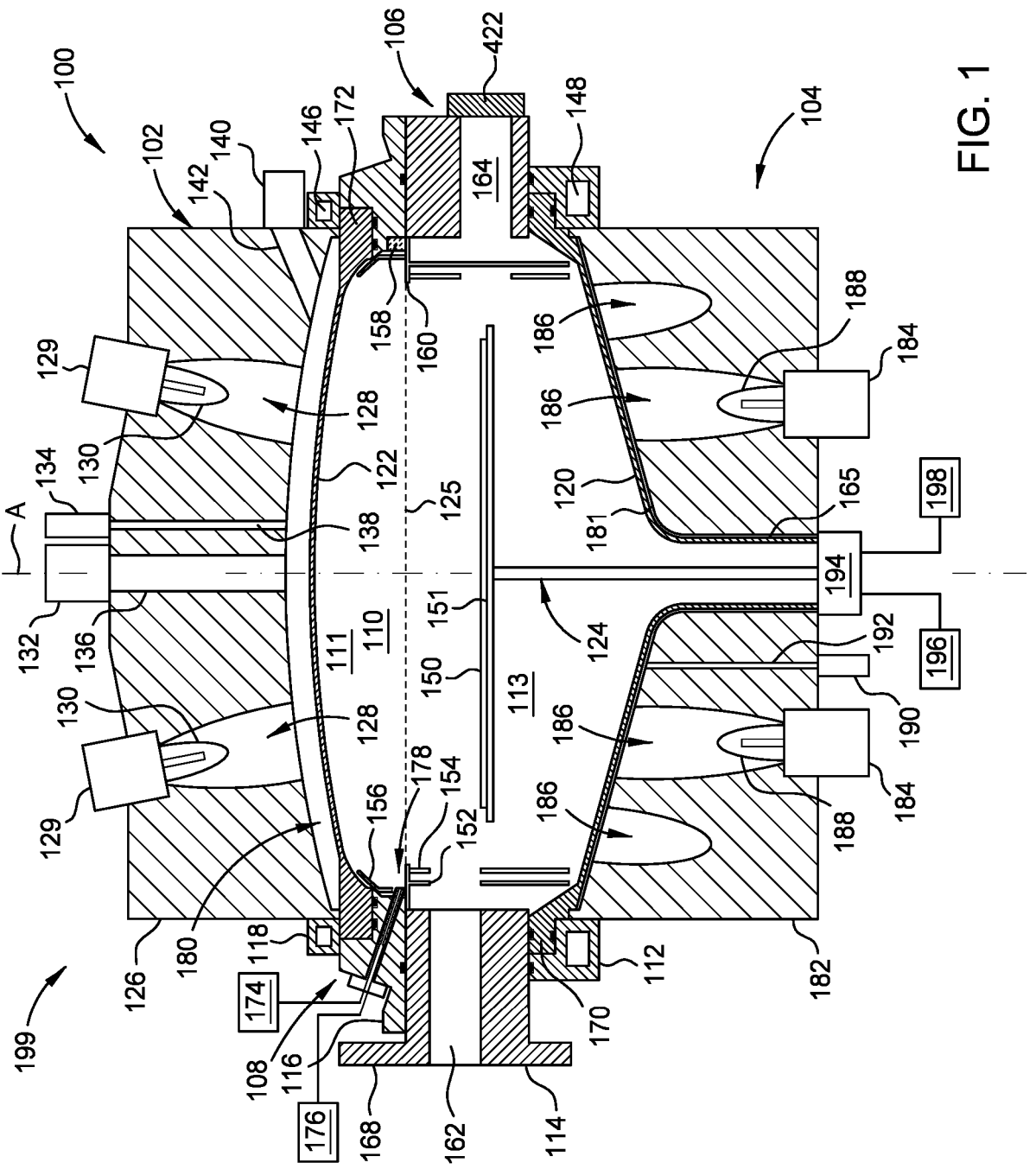
FIG. 1 is a schematic illustration of a process chamber, according to embodiments of the present disclosure.

FIG. 1 is a schematic illustration of an epitaxial chamber 100, according to embodiments of the present disclosure. The epitaxial chamber 100 is an epitaxial deposition chamber and may be used as part of a cluster tool (not shown). The epitaxial chamber 100 is utilized to grow an epitaxial film on a substrate, such as substrate 150.

The epitaxial chamber 100 includes a plurality of temperature control elements 199, a chamber body assembly 106, a susceptor assembly 124, a lower window 120, and an upper window 122. The upper window 122, the chamber body assembly 106 and the lower window 120 enclose an internal volume 110 of the epitaxial chamber 100. The plurality of temperature control elements 199 include lamp modules 101, an upper heater 158, a lower heater 152 and a heated gas passage 136. Each of plurality of temperature control elements 199 can be utilized individually, or with one or more other plurality of temperature control elements 199 to control the temperature of the epitaxial chamber 100 while processing the substrate 150. The lamp modules 101 includes an upper lamp module 102 and a lower lamp module 104.

The susceptor assembly 124 is disposed in the internal volume 110 and configured to support the substrate 150 on a substrate support surface 151. The susceptor assembly 124 is disposed between the upper lamp module 102 and the lower lamp module 104. The lower window 120 is disposed between the susceptor assembly 124 and the lower lamp module 104. The upper window 122 is disposed between the susceptor assembly 124 and the upper lamp module 102.

The upper lamp module 102 is disposed over the susceptor assembly 124 and configured to heat a substrate, such as the substrate 150, disposed on the susceptor assembly 124. The upper lamp module 102 includes an upper module body 126 and a plurality of lamp apertures 128 disposed through the upper module body 126. Each of the plurality of lamp apertures 128 includes a lamp base 129, or socket, in which a single lamp 130 is disposed therein. The orientation of the lamp 130 is generally defined by an imaginary line extending along a filament of the lamp 130 to the tip of the lamp 130. For example, the lamp 130 resting on its side on a surface has its imaginary line aligned with the filament and parallel to the surface. The orientation of the lamp 130 is also perpendicular to a chamber centerline 'A' that extends vertically through the center of the upper lamp module. Each of the lamps 130 are coupled to one of the lamp base 129. Each of the lamp bases 129 supports one of the lamps 130 and electrically couples each of the lamps 130 to a power source (not shown). Each of the lamps 129 are secured within the apertures 128.

The upper lamp module 102 further includes the heated gas passage 136 and a pyrometer passage 138. The heated gas passage 136 is fluidly coupled to a heated gas supply source 132. The heated gas passage 136 extends from the top surface to the bottom surface of the upper module body 126. The heated gas passage 136 is configured to allow heated gas, such as heated air or a heated inert gas, to flow from the heated gas supply source 132 to the top surface of the upper window 122 to convectively heat the upper window 122. Heating the upper window 122 ensures more of the lamps 130 energy is directed to the substrate 150 and not to heating the upper window 122.

Figures 7A, 7B:
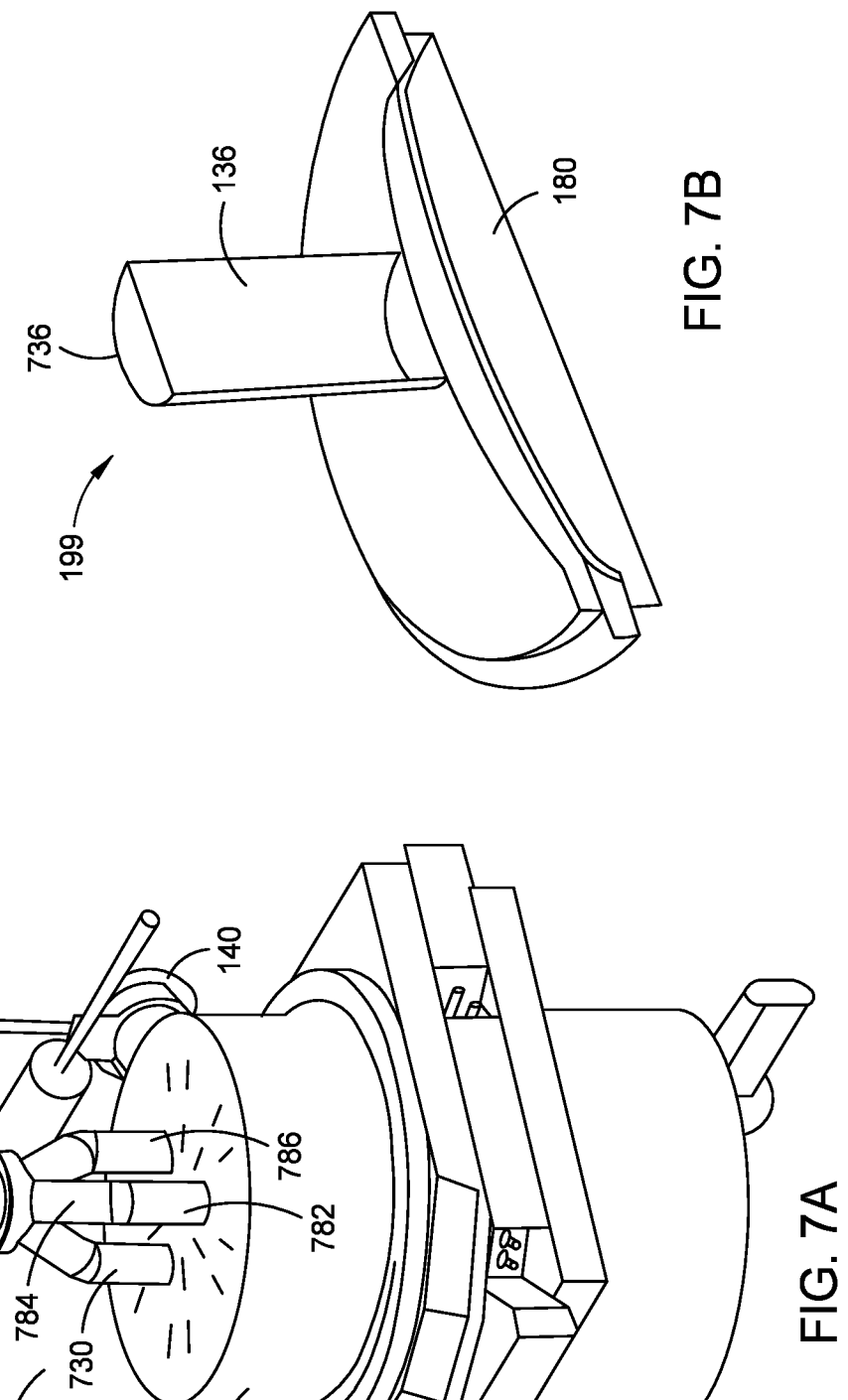
FIG. 7A is schematic view for a dome heater.
FIG. 7B is a schematic cross sectional view of the heated gas passage in the upper lamp module.

The heated gas passage will be discussed with additional references made to FIGS. 7A and 7B. FIG. 7A is schematic view for a dome heater 750. FIG. 7B is a schematic cross sectional view of the heated gas passage 136 in the upper lamp module 102. The heated gas passage 136 has an inlet 736. The heated gas is supplied through the heated gas passage 136 to an upper plenum 180 defined between the upper lamp module 102 and the upper window 122. The heated gas passage 136 may be centrally disposed in the upper lamp module 102. The heated gas passage 136 may have a conical shape. Alternately, the heated gas passage 136 may have a frustoconical shape to promote outward flow into the upper plenum 180. Alternately, the heated gas passage 136 may have more than one passage radially located as shown by alternate heated gas passage 730. The alternate heated gas passage 730 has a first passage 782, a second passage 784 and a third passage 186 for evenly distributing the heated gas. In this manner, greater temperature uniformity of the upper window 122 can be maintained. This advantageously reduces fluctuations of processing temperatures.

The dome heater 750 is coupled to the inlet 736 of the gas passage 136. The dome heater 750 may be an electric resistive, ceramic, radiant or other suitable heater, and incorporates a fan for generating and moving hot air. The dome heater 750 may produce an air outlet temperature of about 1,652° F. into the gas passage 136. The dome heater 750 may have a heated air flow between a minimum of about 4 CFM of air to a maximum of about 16 CFM of heated air. The dome heater 750 is coupled to a controller 752. The controller 752 may utilize on feedback from sensors to maintain the temperature of the upper lamp module 102 and the upper window 122 by regulating the heat from the dome heater 750. For example, the controller 752 may control the heater and/or fan of the dome heater 750 to supply hot air in response to a temperature at the upper lamp module being below a threshold. Or conversely, the controller 752 may control the heater and/or fan of the dome heater 750 to reduce or stop supplying hot air in response to a temperature at the upper lamp module being above a threshold.

The dome heater 750 advantageously heats up the upper window 122 to clean the upper window 122 from parasitic depositions as these depositions could create a coating that could adversely affect lamp heating of the substrate. However, it should be appreciated that the dome heater 750 and gas passage 136 may also implemented for the lower window 120. It is envisioned that the lower window 122 could employ a similar apparatus and method for heating as disclosed above.

Returning back to just FIG. 1, a heated gas exhaust passage 142 is also disposed through the upper module body 126. The heated gas exhaust passage 142 is coupled to a heated exhaust pump 140. The heated exhaust pump 140 removes gas from the upper plenum 180 through the heated gas exhaust passage 142. The heated exhaust pump 140 may also function as an exhaust pump for the process volume. The heated gas exhaust passage 142, in some embodiments, may be a groove or channel formed along an edge of the upper module body 126, or may be formed through or in a separate chamber component in fluid communication with the upper plenum 180.

The pyrometer passage 138 is disposed through the upper module body 126 to enable a pyrometer 134, such as a scanning pyrometer, to measure the temperature of the substrate 150. This pyrometer 134 may also be used to measure the temperature of the chamber walls, liners, etc. The pyrometer 134 is disposed on top of the upper module body 126 adjacent to the pyrometer passage 138. The pyrometer passage 138 extends from the top surface of the upper module body 126 to the bottom surface of the upper module body 126 that is adjacent to the upper window 122.

The lower lamp module 104 is disposed below the susceptor assembly 124 and is configured to heat a bottom side of the substrate 150 when the substrate is disposed on the susceptor assembly 124. The lower lamp module 104 includes a lower module body 182. A plurality of lamp apertures 186 are disposed through the lower module body 182. Each of the plurality of lamp apertures 186 has a lamp 188 disposed therein. Each lamp 188 is coupled to a lamp base 184. Each lamp base 184 supports a corresponding one of the lamps 188 and electrically couples the lamps 188 to a power source (not shown). The orientation of the lamps 188 is generally perpendicular to a vertical centerline of the epitaxial chamber 100. For example, the orientation of the lamps 188 is generally defined by an imaginary line extending through a filament to the tip of the lamp 188. The lamps 188 may be disposed in an orientation generally perpendicular to the substrate 150.

The lower lamp module 104 further includes a susceptor shaft passage 195 and a pyrometer passage 192. The susceptor shaft passage 195 is disposed through the middle of the lower module body 182. A support shaft is disposed through the susceptor shaft passage 195 and coupled to the susceptor 124. The susceptor shaft passage 195 is sized to allow the support shaft of the susceptor 124 to pass through the lower module body 182.

The pyrometer passage 192 is disposed through the lower module body 182 to enable a pyrometer 190, such as a scanning pyrometer, to measure the temperature of the bottom surface of the substrate 150 or the bottom surface of the substrate support. The pyrometer 190 is disposed below the lower module body 182, aligned with and adjacent to the pyrometer passage 192. The pyrometer passage 192 is disposed from the bottom surface of the lower module body 182 to the top surface of the lower module body 182 that is adjacent to the lower window 120.

The chamber body assembly 106 includes an inject ring 116 and a base ring 114. The inject ring 116 is disposed on top of the base ring 114. The inject ring 116 includes one or more gas injectors 108 disposed therethrough. The base ring 114 includes a substrate transfer passage 162, one or more upper chamber exhaust passages, and a lower chamber exhaust passage 164. The substrate transfer passage 162 is disposed through the base ring 114 opposite the one or more upper chamber exhaust passages and the lower chamber exhaust passage 164. Each of the one or more upper chamber exhaust passages are disposed through base ring 114 and coupled to an exhaust module. The lower chamber exhaust passage 164 is also disposed through the base ring 114.

An upper chamber 111 is a portion of the internal volume 110 in which the substrate 150 is processed and process gases are injected through the gas injectors 108. The lower chamber 113 is a portion of the internal volume 110 in which the substrate 150 is loaded onto the susceptor assembly 124. The upper chamber 111 may also be described as the volume above substrate support surface 151 of the susceptor assembly 124 while the susceptor assembly 124 is in a processing position. The lower chamber 113 is the volume below the substrate support surface 151 of the susceptor assembly 124 while the susceptor assembly 124 is in the processing position. The processing position (not shown) is the position wherein the substrate 150 is disposed even with or above a horizontal plane reference 125. The horizontal reference plane 125 is a plane through which the inject ring 116 and the base ring 114 contact one another. The horizontal reference plane 125 is perpendicular to the vertical centerline of the epitaxial chamber 100.

The one or more upper chamber exhaust passages and the lower chamber exhaust passage 164 are coupled to one or more exhaust pumps (not shown). The one or more exhaust pumps are configured to remove exhaust gases from the internal volume 110 via the one or more upper chamber exhaust passages and the lower chamber exhaust passage 164. In some embodiments, each of the upper chamber exhaust passages and the lower chamber exhaust passage 164 are coupled to a single exhaust pump using a plurality of conduits. In another embodiment, the upper chamber exhaust passages are coupled to a different exhaust pump than the lower chamber exhaust passage 164.

The substrate transfer passage 162 is formed through the base ring 114. The substrate transfer passage 162 is configured to allow a substrate to pass therethrough from a transfer chamber of a cluster tool (not shown). A flange 168 is attached to one end of the base ring 114 to enable the attachment of the epitaxial chamber 100 to a cluster tool (not shown). The substrate transfer passage 162 passes through the flange 168.

An upper cooling ring 118 and a lower cooling ring 112 are disposed on opposite sides of the chamber body assembly 106. The upper cooling ring 118 is disposed on top of the inject ring 116 and is configured to cool the inject ring 116. The lower cooling ring 112 is disposed below the base ring 114 and is configured to cool the base ring 114. The upper cooling ring 118 includes a coolant passage 146 disposed therethrough. A coolant circulated through the coolant passage 146, may include water, oil or other suitable heat transfer fluid. The lower cooling ring 112 includes a coolant passage 148 disposed therethrough. A coolant circulated through the coolant passage 148 is similar to the coolant circulated through the coolant passage 146 of the upper cooling ring 118. In some embodiments, the upper cooling ring 118 and the lower cooling ring 112 assist in securing the inject ring 116 and the base ring 114 in the epitaxial chamber 100. The upper cooling ring 118 may partially support the upper lamp module 102 while the lower cooling ring 112 may partially support the base ring 114 and the inject ring 116.

The use of the upper cooling ring 118 and the lower cooling ring 112 reduces the temperature are devised to cool the O-ring or vacuum seal area to less than 250° C. This increases the longevity of the O-ring for maintaining a good vacuum seal while reducing downtime for maintenance.

The gas injectors 108 of the inject ring 116 are disposed through openings formed through the inject ring 116. In the example illustrated in FIG. 1, a plurality of gas injectors 108 are disposed through the inject ring 116. Each gas injector 108 is configured to supply process gases to the internal volume 110 via one or more gas outlets 178. For simplicity of discussion, a single gas injector 108 is shown in FIG. 1. The gas injector 108 is shown as being disposed at an acute angle relative the horizontal plane so the one or more gas outlets 178 are pointed downward toward the susceptor 124 and the substrate 150 residing below the gas injectors 108. Each of the gas injector 108 are fluidly coupled to one or more process gas supply sources, such as the first process gas supply source 174 or the second process gas supply source 176. In some embodiments, only a first process gas supply source 174 is utilized. In some embodiment in which both the first process gas supply source 174 and the second process gas supply source 176 are utilized, there are two gas outlets 178 within each gas injector 108. The two gas outlets 178 are formed in a single gas injector 108 and disposed in a stacked fashion to enable mixing of the gases only after the gases exit the gas injector 108 through the gas outlets 178 and enter the internal volume 110.

The upper window 122 is disposed between the inject ring 116 and the upper lamp module 102. The upper window 122 is an optically transparent window, such that radiant energy produced by the upper lamp module 102 passes therethrough. In some embodiments, the upper window 122 is formed of a quartz or a glass material. The upper window 122 has a dome shape and in some embodiments, is also called an upper dome. The outer edges of the upper window 122 form peripheral supports 172. The peripheral supports 172 are thicker than the central portion of the upper window 122. The peripheral supports 172 are disposed on top of the inject ring 116. The peripheral supports 172 connect to the central portion of the upper window 122 and are formed of the optically transparent material of the central portion of the upper window 122.

The lower window 120 is disposed between the base ring 114 and the lower lamp module 104. The lower window 120 is optically transparent, such that radiant energy produced by the lower lamp module 104 passes therethrough. In some embodiments, the lower window 120 is formed from a quartz or a glass material. The lower window 120 has a dome shape, and in some embodiments, is also called a lower dome. The outer edges of the lower window 120 form peripheral supports 170. The peripheral supports 170 are thicker than the central portion of the lower window 120. The peripheral supports 170 connect to the central portion of the lower window 120 and are formed of the same optically transparent material.

A variety of liners and heaters are disposed inside of the chamber body assembly 106 and within the internal volume 110. As shown in FIG. 1, an upper liner 156 and a lower liner 154 are disposed within the chamber body assembly 106. The upper liner 156 is disposed above the lower liner 154 and inward of the inject ring 116. The lower liner 154 is disposed inward of the base ring 114. The upper liner 156 and the lower liner 154 are coupled together while in the process volume. The upper liner 156 and the lower liner 154 shield the inner surfaces of the inject ring 116 and the base ring 114 from the process gases within the process volume. The upper liner 156 and the lower liner 154 further serve to reduce heat transfer from the process volume to the inject ring 116 and the base ring 114. Reduced heat transfer improves uniform heating of the substrate 150 and enables more uniform deposition on the substrate 150 during processing.

The lower chamber exhaust passage 164 is disposed across from the substrate transfer passage 162 and connects the lower chamber exhaust passage 164 with an exhaust pump (not shown). The exhaust pump may also be coupled to and be in fluid communication with both of the upper chamber exhaust passage openings.

The lower liner 154 is located inside of the opening of the base ring 114. The lower liner 154 has ring shaped and has a lower liner body. The lower liner 154 is configured to separate the inner surface of the base ring 114 from the internal volume 110. The upper liner 156 shields the inner surface of the base ring 114 from process gases within the internal volume 110 and further protects the internal volume 110 from particles or other contaminants released by the base ring 114 and the lower heater 152.

The upper heater 158 and the lower heater 152 are also disposed within the chamber body assembly 106 and the internal volume 110. The upper heater 158 is disposed between the upper liner 156 and the inject ring 116, while the lower heater 152 is disposed between the lower liner 154 and the base ring 114. Both of the upper heater 158 and the lower heater 152 are disposed inward of the chamber body assembly 106 to enable more uniform heating of the substrate 150 while the substrate 150 is within the epitaxial chamber 100. The upper heater 158 and the lower heater 152 reduce heat loss to the walls of the chamber body assembly 106 by heating the walls and preventing the walls from becoming a heat sink during processing. Thus, the upper heater 158 and the lower heater 152 create a more uniform temperature distribution around the surfaces forming the internal volume 110. Each of the upper liner 156, the lower liner 154, the upper heater 158, and the lower heater 152 is coupled to a flange 160 disposed within the internal volume 110. The flange 160 is a horizontal surface that is secured, e.g., clamped, between a portion of the inject ring 116 and the base ring 114 to secure each of the upper liner 156, the lower liner 154, the upper heater 158, and the lower heater 152. In embodiments described herein, the upper heater 158 may include any suitable heater such as a lamp, infrared heater, heat transfer fluid conduits or resistive heating elements among other types of heaters. The upper heater 158 is further shaped to accommodate openings through the inject ring 116 and the base ring 114. Similarly, the lower heater 152 may be similarly configured to the upper heater 158. The lower heater 152 is further shaped to accommodate openings through the inject ring 116 and the base ring 114.

The susceptor assembly 124 is disposed within the internal volume 110 and is configured to support the substrate 150 during processing. The susceptor assembly 124 includes a planar upper surface for supporting the substrate 150 and a shaft that extends through a portion of the lower window 120 and the lower lamp module 104. The susceptor assembly 124 is coupled by the shaft to a movement assembly 194. The movement assembly 194 includes a rotation assembly 196 and a lift assembly 198. The rotation assembly 196 is configured to rotate of the susceptor assembly 124 about a central axis A, while the lift assembly 198 is configured to move the susceptor assembly 124 linearly within the internal volume 110 along the central axis A. The central axis A is also the vertical centerline of the epitaxial chamber 100.

Figures 2A, 2B, 2C:
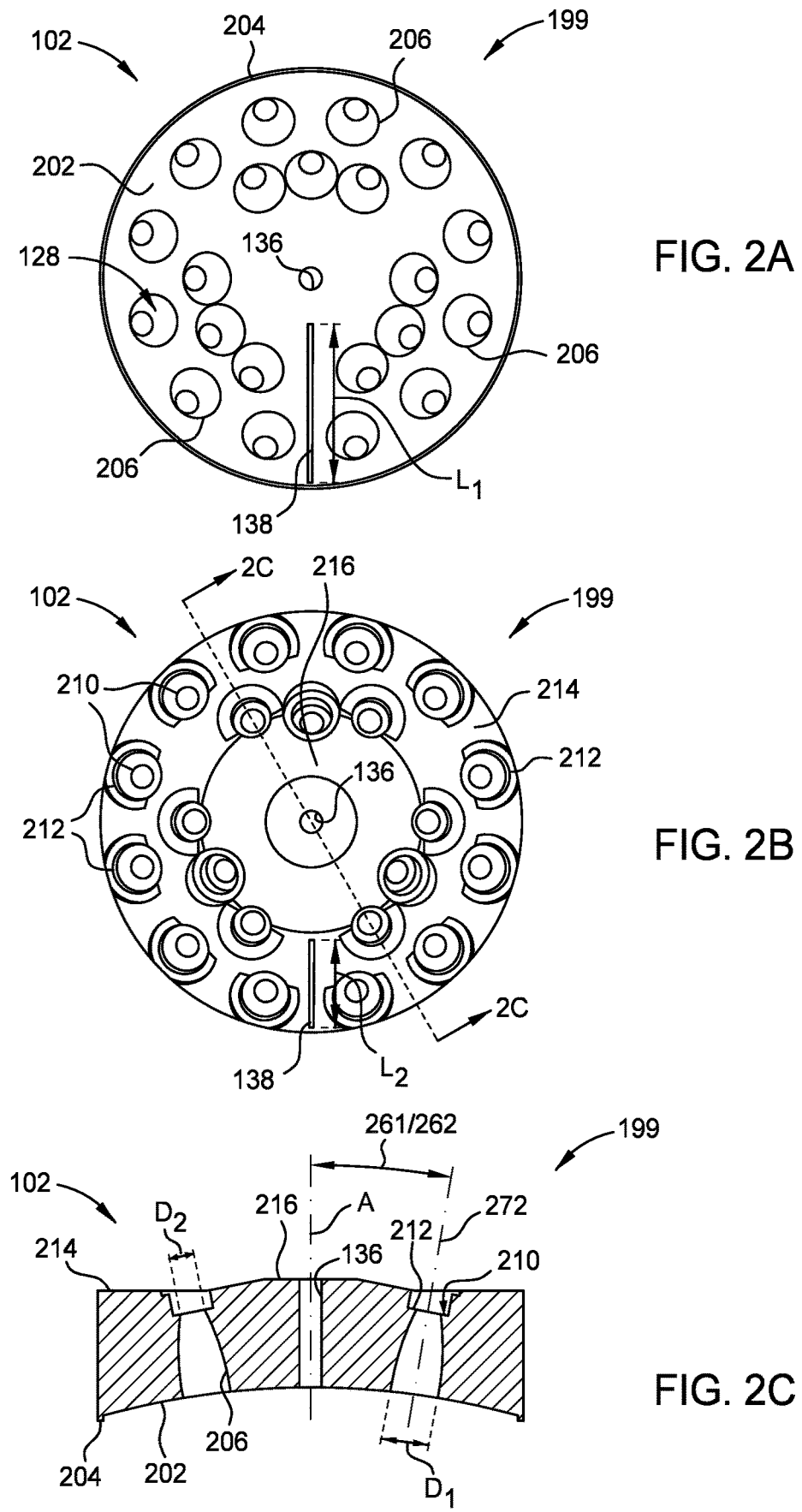
FIG. 2A is a schematic bottom view of an upper lamp module, according to embodiments of the present disclosure.
FIG. 2B is a schematic plan view of the upper lamp module of FIG. 2A, according to embodiments of the present disclosure.
FIG. 2C is a schematic cross sectional view of the upper lamp module taken through section line 2C-2C of FIG. 2A, according to embodiments of the present disclosure.

FIG. 2A is a schematic bottom view of an upper lamp module 102, according to embodiments of the present disclosure. The upper module body 126 of the upper lamp module 102 further includes a bottom surface 202, a top surface 214 (FIG. 2B) and a support ridge 204 disposed around an outer edge of the bottom surface 202. The support ridge 204 supports the upper module body 126 by contacting a portion of the upper window 122 (shown in FIG. 1), while providing a separation between the rest of the bottom surface 202 and the upper window 122. The support ridge 204 disposed on the outside of the bottom surface 202 distributes the weight of the upper module body 126 around the peripheral supports 172 or a section of the chamber body assembly 106 instead of being solely support by the central portion of the upper window 122. Distributing the weight reduces the probability of the upper window 122 from fracturing. The upper plenum 180 created by spacing the upper window 122 from the upper module body 126 allows the upper window 122 to be heated or cooled using a gas flowed through the upper plenum 180. The gas may be provided to the upper plenum 180 from a gas source, such as the heated gas source 132. The bottom surface 202 is curved and has a shape similar to the central portion of the upper window 122. The bottom surface 202 is concave.

Each of the lamp apertures 128 include an inner wall 206. Each of the inner walls 206 form a circular or elliptical opening at the bottom surface 202. The inner walls 206 are configured to reflect radiative energy and focuses of the radiative energy of the lamps 130 (shown in FIG. 1) and allows a controlled energy distribution of the radiative energy across the substrate 150. In embodiments described herein, each of the inner walls 206 are curved, such that the inner walls 206 form portions of an ellipse. In other embodiments, the inner walls 206 are vertical. The inner walls 206 have a reflectance of greater than about 90%, such as greater than about 98% for wavelengths between about 700 nm to about 15000 nm, such as about 700 nm to about 1000 nm or about 1000 nm to about 15000 nm. The inner walls 206 may have a reflective coating, such as a coating of gold, polished aluminum, or other polished materials with a high reflectivity for infrared wavelengths. In some embodiments, the upper module body 126 is formed of a reflective material, such as aluminum or steel. In some embodiments, the upper module body 126 is formed from a first material, such as aluminum or steel, and plated in a second material. The second material may be any one of copper, nickel, brass, bronze, silver, gold, aluminum, or an alloy thereof. The second material may be polished to increase the reflectivity. The bottom surface 202 is also reflective in some embodiments. The bottom surface 202 may have a reflectance of greater than about 90%, such as greater than about 98% for wavelengths between about 700 nm to about 15000 nm, such as about 700 nm to about 1000 nm or about 1000 nm to about 15000 nm. The bottom surface 202 is made from or coated with a material similar to the inner walls 206.

The inner walls 206 extend vertically through the upper module body 126, such that the inner walls 206 extend away from the bottom surface 202 and towards the top surface 214. The generally vertical orientation of the inner walls 206, and therefore the lamp apertures 128, enables a more focused distribution of radiant energy on a substrate. The generally vertical orientation of the lamp apertures 128 further reduces the radiant energy absorbed by the upper module body 126. The inner walls 206 form a portion of a spheroid. Each of the lamp apertures 128 include a central axis coincident with the central axis A about which the inner walls 206 are formed. The central axis through each of the lamp apertures 128 have a common intersection point below bottom surface 202 of the upper lamp module 102, such that each of the lamp apertures 128 face inward toward the central axis A.

As shown herein, the pyrometer passage 138 is a slit disposed through the upper module body 126. The pyrometer passage 138 has a first length $L_1$ at the bottom surface 202, and a second length $L_2$ at the top surface 214 (FIG. 2B). The first length $L_1$ is longer than the second length $L_2$. The first length $L_1$ is longer than the second length $L_2$ to reduce the opening at the top surface 214 while allowing full scanning of the top of the substrate 150 by a scanning pyrometer, such as the pyrometer 134. The heated gas passage 136 is disposed through the center of the upper module body 126.

FIG. 2B is a schematic plan view of the upper lamp module 102 of FIG. 2A. As shown in FIG. 2B, each of the plurality of lamp apertures 128 further includes a lamp base support 212 and a bulb opening 210 disposed through each of the lamp base supports 212. The bulb openings 210 connect the lamp base supports 212 and the reflective inner walls 206. The lamp base supports 212 are stepped surfaces disposed around the bulb openings 210. Each lamp base support 212 includes a center bore 211 and an arc shaped recess 213 that surrounds the center bore. The lamp base supports 212 are configured to support a lamp base 129. The bulb openings 210 are circular openings disposed through a bottom surface 215 of the lamp base supports 212. The bulb openings 210 are sized to allow the bulb of the lamps 130 to pass therethrough.

The top surface 214 of the upper lamp module 102 includes a raised portion 216. The raised portion 216 is raised slightly relative to the outer portion of the top surface 214. The raised portion 216 increases the structural strength of the upper lamp module 102 and reduces deflection of the upper lamp module 102 when supporting the lamps 130 and measurement tools, such as a pyrometer 134.

FIG. 2C is a schematic cross sectional view of the upper lamp module 102 of FIGS. 2A-2B through the section line 2C-2C. The central axis A extends through the top surface and the bottom surface of the upper lamp module 102. The upper module body 126 is centered about central axis A. Each of the reflective inner walls 206 is configured to reflect light around the lamp apertures 128 from the bulb and direct light toward the substrate 150 (shown in FIG. 1) through the opening 217 formed by the inner walls 206. The openings 217 of the lamp apertures 128 are disposed at the intersection of the inner walls 206 and the bottom surface 202. The inner wall 206 and the opening 217 of each lamp apertures 128 circumscribed a lamp aperture axis E. The lamp opening axis E is a centerline through the lamp aperture 128 and is disposed at an angle ϕ with respect to the central axis A. The angle ϕ is less than about 45 degrees, such as less than about 30 degrees, such as less than about 20 degrees. Each of the lamp apertures 128 include a similar lamp aperture axis E and are disposed at an angle ϕ with respect to the central axis A. Not all lamp aperture axes E have the same angle ϕ, but are angled within the angle ϕ range described above.

A centerline 272 of the lamp apertures 128 may be oriented at an angle 262 relative to the central axis A. The centerline 272 of the lamp apertures 128 may be oriented at an angle 269 relative to a centerline 299 of the upper lamp module 102. Each centerline 272 of each lamp aperture 128 may be radially aligned such that each lamp aperture 128 centerline 272 intersects at the centerline 299 of the upper lamp module 102. It should be noted that the intersection of the centerlines 272 is well below the substrate support surface 151. The centerline 272 of the lamp apertures 128 may be oriented at an angle 269 relative to the bottom surface 202 of the upper lamp module 102. The bottom surface 202 may be curved such that the angle 269 of the centerline 272 is orthogonal to a tangent of the bottom surface 202 at the intersection of the centerline 272 with the bottom surface 202. It should be appreciated that the various descriptions above for the orientation angle 262 for each lamp aperture 128 may be slightly different to satisfy the conditions of the descriptions. For example, lamp apertures 128 may be arranged in two or three concentric circular rings with the angle 262 of the lamp apertures 128 in an outer ring being different than the angle 262 of the lamp apertures 128 in an inner ring. In a comparison of the angle 262 comprising the lamp apertures 128, the lamp apertures 128 in the outer ring may have a shallower, or smaller, angle 262 than the lamp apertures 128 in the inner ring.

Each of the openings 217 have a first diameter $D_1$ at the bottom surface 202. The first diameter $D_1$ is about 10 mm to about 50 mm, such as about 20 mm to about 40 mm. The first diameter $D_1$ is selected to control the distribution of radiant energy and the focal point of the radiant energy leaving each of the plurality of lamp apertures 128. Each of the bulb openings 210 has a second diameter $D_2$. The lamp aperture axis E similarly passes through the center of the bulb openings 210, such that the opening 217 and the bulb opening 210 are concentric about the lamp aperture axis E. The second diameter $D_2$ is about 5 mm to about 40 mm, such as about 10 mm to about 30 mm. The second diameter $D_2$ is large enough to allow the bulb of one of the lamps 130 to pass therethrough, but small enough to reduce heat loss through the bulb openings 210. In some embodiments, the ratio of the size of the first diameter $D_1$ to the size of the second diameter $D_2$ is about 2:1 to about 5:4, such as about 2:1 to about 4:3, such as about 2:1 to about 3:2. The ratio of the first diameter $D_1$ to the second diameter $D_2$ configured to produce a desired energy distribution on a substrate disposed below the upper module body 126. In some embodiments, the largest diameter of the bulb of each of the lamps 130 is less than 1 mm smaller than the second diameter $D_2$.

The plurality of lamp apertures 128 are disposed in distinctive zones. As shown herein, the plurality of lamp apertures 128 are disposed in three zones. The three zones may each be roughly pie-shaped, such that each of the zones form a sector of a circle. In the example where the zones are arranges as sectors of a circle, each sector may encompasses about 120 degrees of the upper lamp module 102. Alternately the three zones may be concentrically arranged. In yet other examples, the zones may be arranged in a spiral. Each zone contains a distinct group of lamp apertures 128.

Each zone contains about 5-10 lamp apertures 128, such as about 6-8 lamp apertures 128. The zones are each arranged to heat different portions of a substrate. Each of the zones of the plurality of lamp apertures 128 includes an inner subset of lamp apertures 128 and an outer subset of lamp apertures 128. Within the inner subset of lamp apertures 128 are multiple lamp apertures 128. The lamp apertures 128 within the inner subset of lamp apertures 128 have a small distance between each other. The small distance is less than the distance from one of the lamp apertures 128 within the inner subset to any lamp aperture 128 within a second inner subset of lamp apertures 128 within an adjacent zone. The lamp apertures 128 within the outer subset of lamp apertures 128 are spaced uniformly on the upper lamp module 102. Each lamp aperture 128 within the outer subset of lamp apertures 128 are an equal distance from an adjacent lamp aperture 128 within a second outer subset as an adjacent lamp aperture 128 within the same outer subset.

Other arrangements of the plurality of lamp apertures 128 are also contemplated. One alternative arrangement for the plurality of lamp apertures 128 may include arranging the plurality of lamp apertures 128 in a plurality of concentric rings, such a two or three concentric rings, or in another manner having an even distribution of lamp apertures 128 across the upper lamp module 102.

The generally orientation of the lamps 130 may be dictated by the shape and arrangement for each lamp aperture 128. The generally orientation of the lamps 130 in each lamp aperture 128 may be at an angle 261 from the central axis A. The angle 261 may result in a perpendicular orientation of the lamps 130 to the substrate support surface 151 of the susceptor assembly 124. The angle 261 to the substrate support surface 151 may be at about +/−60 degrees with respect to the central axis A, such as about +/−45 degrees with respect to the central axis A, such as about +/−20 degrees with respect to the central axis A. In some examples, the bottom surface 202 may be curved, such as parabolic, and each lamp 130 may be oriented orthogonally to the bottom surface 202. In yet other examples, each lamp 130 in a respective first zone is at first angle and each lamp 130 in a respective second zone is oriented at a second angle wherein the first angle is not equal to the second angle. In such a zonal arrangement, it is further contemplated that lamps 130 in zones further from the central axis A would be at an angle greater than the lamps 130 in zones closer to the central axis A.

Figures 3A, 3B, 3C:
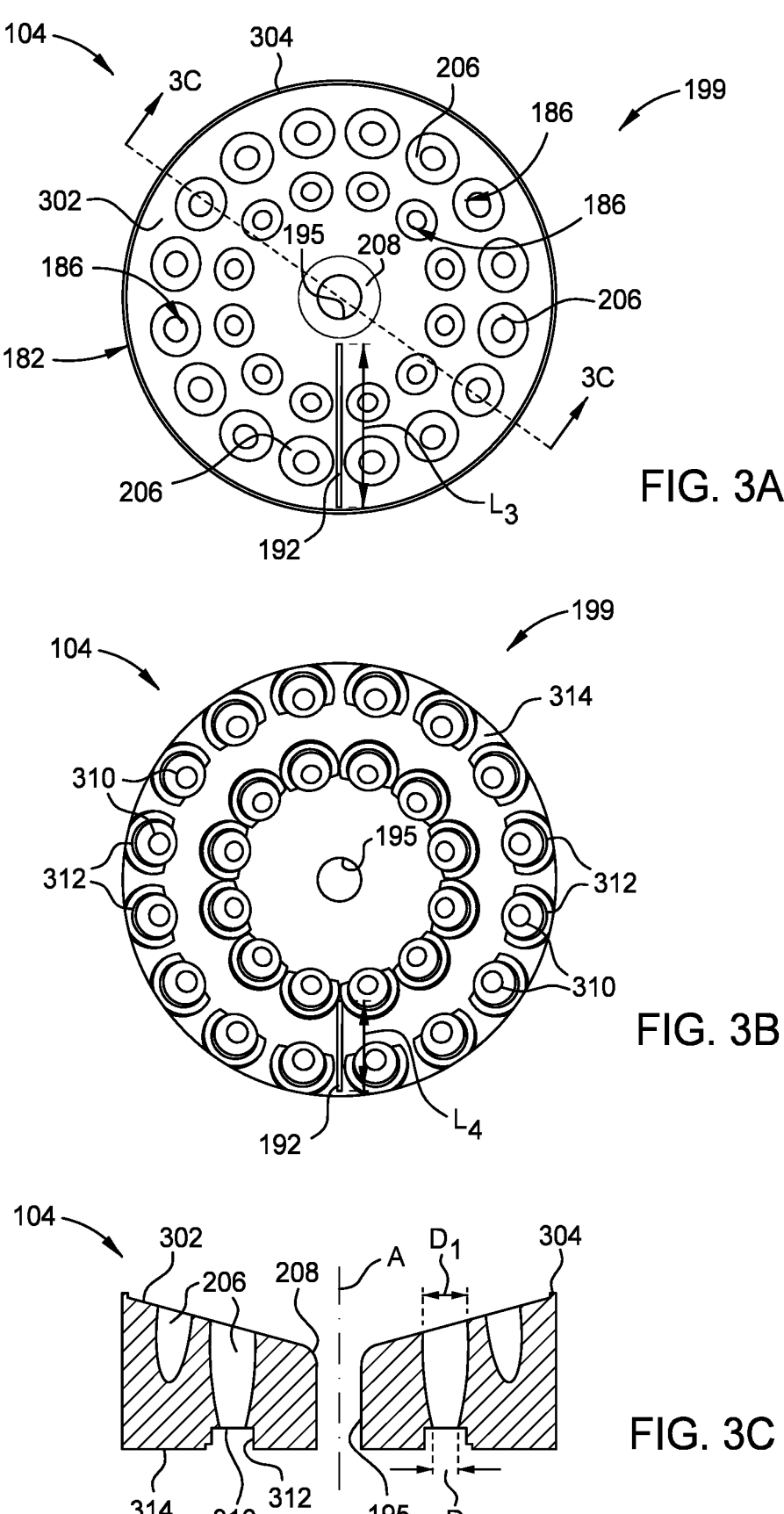
FIG. 3A is a schematic bottom view of a lower lamp module, according to embodiments of the present disclosure.
FIG. 3B is a schematic plan view of the lower lamp module of FIG. 3A, according to embodiments of the present disclosure.
FIG. 3C is a schematic cross sectional view of the lower lamp module taken through section line 3C-3C of FIG. 3A, according to embodiments of the present disclosure.

FIG. 3A is a schematic top view of the lower lamp module 104. The lower module body 182 of the lower lamp module 104 further includes a top surface 302, a bottom surface 314 (shown in FIG. 3B) and a support ridge 304 disposed around an outer edge of the top surface 302. The support ridge 304 is a ring disposed around the top surface 302 of the lower module body 182 and extending outward from the lower module body 182. The support ridge 304 is configured to separate the top surface 302 of the lower module body 182 from the lower window 120 by contacting a portion of the lower window 120 (shown in FIG. 1), while providing a separation between the rest of the bottom surface 202 and the lower window 120. The support ridge 304 enables the lower module body 182 to only contact the peripheral supports 170 or a section of the chamber body assembly 106 instead of the central portion of the lower window 120. This reduces the likelihood of the lower window 120 fracturing and forms a lower plenum 181. The top surface 302 has a similar shape to the central portion of the lower window 120. In embodiments described herein, the top surface 302 is concave.

Each of the lamp apertures 186 include an inner wall 306. Each of the inner walls 306 are similar to the inner walls 206 of the upper lamp module 102. The inner walls 306 of the lamp apertures 186 are configured to reflect radiative energy to enable focusing of the radiative energy from the lamps 188 (shown in FIG. 1) and allow a controlled energy distribution across the substrate 150. Each of the inner walls 306 form a circular or elliptical opening to the lamp apertures 186 at the top surface 302.

The inner walls 306 extend vertically through the lower module body 182, such that the inner walls 306 extend away from the top surface 302 and towards the bottom surface 314. The vertical orientation of the inner walls 306 and therefore the lamp apertures 186 enables more focused distribution of radiant energy on a substrate. The vertical orientation of the lamp apertures 186 further reduces the radiant energy absorbed by the lower module body 182.

In some embodiments, the lower module body 182 is formed from a first material, such as aluminum or steel, and plated with a second material. The second material may be any one of copper, brass, bronze, silver, gold, aluminum, or an alloy thereof. In some embodiments, the lower module body 182 does not include a second material coating and is instead a single material. The lower module body 182 may have a polished top surface 302. The top surface 302 is also reflective in some embodiments. The top surface 302 may have a reflectance of greater than about 90%, such as greater than about 98% for wavelengths between about 700 nm to about 15000 nm, such as about 700 nm to about 1000 nm or about 1000 nm to about 15000 nm. The top surface 302 is made from or coated with a material similar to the reflective inner walls 306.

As shown herein, the pyrometer passage 192 is a slit disposed through the lower module body 182. The pyrometer passage 192 has a third length $L_3$ at the top surface 302, and a fourth length $L_4$ at the bottom surface 314 (FIG. 3B). The third length $L_3$ is longer than the fourth length $L_4$. The third length $L_3$ is longer than the fourth length $L_4$ to reduce the opening at the bottom surface 314 while allowing full scanning of the bottom of the substrate 150, or the bottom of a susceptor, by a scanning pyrometer, such as the pyrometer 190.

As shown in FIG. 1, the susceptor shaft passage 195 is disposed along the central axis A through the center of the lower module body 182. The susceptor shaft passage 195 is disposed between and connects the top surface 302 and the bottom surface 314 of the lower module body 182. The portion of the susceptor shaft passage 195 adjacent to the top surface 302 includes a curved surface 208. The curved surface 208 is configured to follow the shape of the lower window 120 as the lower window 120 is curved to pass through the susceptor shaft passage 195. The curved surface 208 connects the bottom surface 314 and the inner surface of the susceptor shaft passage 195.

FIG. 3B is a schematic plan view of the lower lamp module 104 of FIG. 3A, according to embodiments of the present disclosure. As shown in FIG. 3B, each of the plurality of lamp apertures 186 further includes a lamp base support 312 and a bulb opening 310 disposed through each of the lamp base supports 312. The bulb openings 310 connect the lamp base supports 312 and the inner walls 306. The lamp base supports 312 are stepped surfaces disposed around the bulb openings 310. Each lamp base support 312 includes a center bore 311 and an arc shaped recess 313 that surrounds the center bore. The lamp base supports 312 are configured to support and/or couple to a lamp base 184. The bulb openings 310 are circular openings disposed through a top surface of the lamp base supports 312. The bulb openings 310 are sized to allow the bulb of the lamps 188 to pass therethrough.

FIG. 3C is a schematic cross sectional view of the lower lamp module 104 of FIG. 3A through the plane 3C-3C. As shown in FIG. 3C the lower module body 182 is centered about the central axis B. In some embodiments, intersection of the inner walls 306 and the top surface 302 forms an opening 317. The opening 317 has a first diameter $D_1$. In some embodiments, the opening 317 is an ellipse or an oval. In these embodiments, the first diameter $D_1$ would be the major axis length of the opening 317. The first diameter $D_1$ is similar to the first diameter $D_1$ as described with reference to the upper module body 126. Each of the bulb openings 310 has a second diameter $D_2$. The second diameter $D_2$ is similar to the second diameter $D_2$ as described with reference to the upper module body 126. In some embodiments, the largest diameter of the bulb of each of the lamps 188 is less than 1 mm smaller than the second diameter $D_2$.

Each of the reflective inner walls 306 are configured to reflect light around the lamp apertures 186 from the bulb and direct light toward the substrate 150 (FIG. 1) through the opening 317 formed by the inner walls 306. The opening 317 is disposed at the intersection of the inner walls 306 and the top surface 302. The walls of the inner wall 306 and the opening 317 of one of the lamp apertures 186 circumscribed a lamp aperture axis F. The lamp opening axis F is a centerline through the lamp aperture 186. The lamp aperture axis F similarly passes through the center of the bulb openings 310, such that the opening 317 and the bulb opening 310 are concentric about the lamp aperture axis F.

The plurality of lamp apertures 186 in the lower lamp module 104 are disposed in zones. The zones may be configured similarly to those described above with respect to the upper lamp module 102. As shown herein, the plurality of lamp apertures 186 are disposed in two concentric zones. Each zone includes a ring of lamp apertures 186 disposed on a common diameter about a centerline of the susceptor shaft passage 195, which also is the centerline of the epitaxial chamber 100. Each ring of lamp apertures 186 includes at least three lamp apertures 186. In embodiments described herein, an inner zone includes a ring with 8 to 16 lamp apertures 186, such as 10 to 14 lamp apertures 186. An outer zone includes a ring with 12 to 20 lamp apertures 186, such as 14 to 18 lamp apertures. As described herein, the outer zone includes more lamp apertures 186 than the inner zone.

The orientation of the lamps 188 can be defined with respect to the central axis A. The central axis A extends through the top surface 302 and the bottom surface 314 of the lower lamp module 104. The upper module body 126 is centered about central axis A. The orientation of the lamps 188 may be parallel to central axis A. Alternately, the orientation of the lamps 188 may be described as being perpendicular to the bottom surface 314 of the of the lower lamp module 104. In some examples, the orientation of the lamps 188 may at an angle greater than 0 degrees with respect to the central axis A, such as about +/−60 degrees with respect to the central axis A, such as an angle of about +/−45 degrees with respect to the central axis A, such as an angle of about +/−20 degrees with respect to the central axis A. In one example, the orientation of the lamps 188 are at an angle 0 degrees with respect to the central axis A. In another example, each lamp 188 in a respective first zone is at a first angle different than a second angle for each lamp 188 in a respective second zone.

Figure 4A:
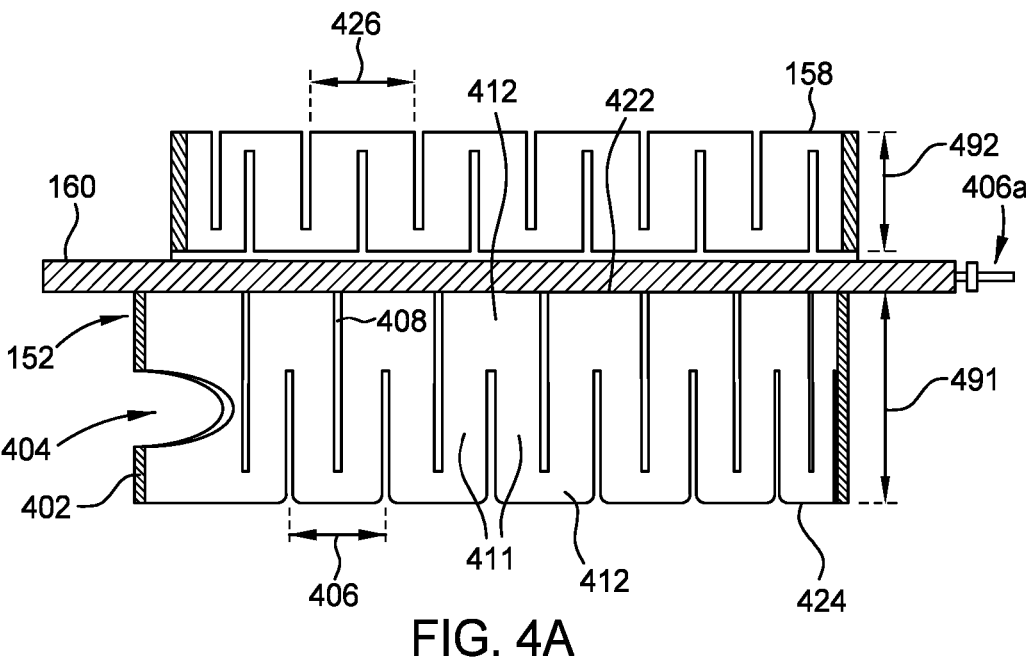
FIG. 4A is schematic cross sectional view of an upper heater and a lower heater, according to embodiments of the present disclosure.

FIG. 4A is schematic cross sectional view of the upper heater 158 and the lower heater 152, according to a first embodiment of the present disclosure. The lower heater 152 is coupled to the flange 160. The upper heater 158 is disposed above the flange 160. The lower heater 152 is spaced by the flange 160 from the lower liner 154 and the base ring 114. In one example, the lower heater 152 is not in contact with one or more of the lower liner 154 and the base ring 114. Thus, the lower heater 152 heats the space between the lower liner 154 and the base ring 114 and in particular the base ring 114. The arrangement advantageously allows the lower heater 152 to be replaced and serviced independently of the lower liner 154 and the base ring 114.

The lower heater 152 may have one or more heating elements. In one example, the heating elements is a resistive heating element 402. Other types of heaters are also contemplated. The lower heater 152 prevents the walls from becoming heat sinks during processing and reduces thermal losses to the walls of the epitaxial chamber 100. In particular, the lower heater 152 is configured to compensate for heat losses from the internal volume 110 to the base ring 114. Compensating for the heat lost to base ring 114 allows the temperature of the internal volume 110 to be more easily maintained at a desired temperature.

Figure 4B:
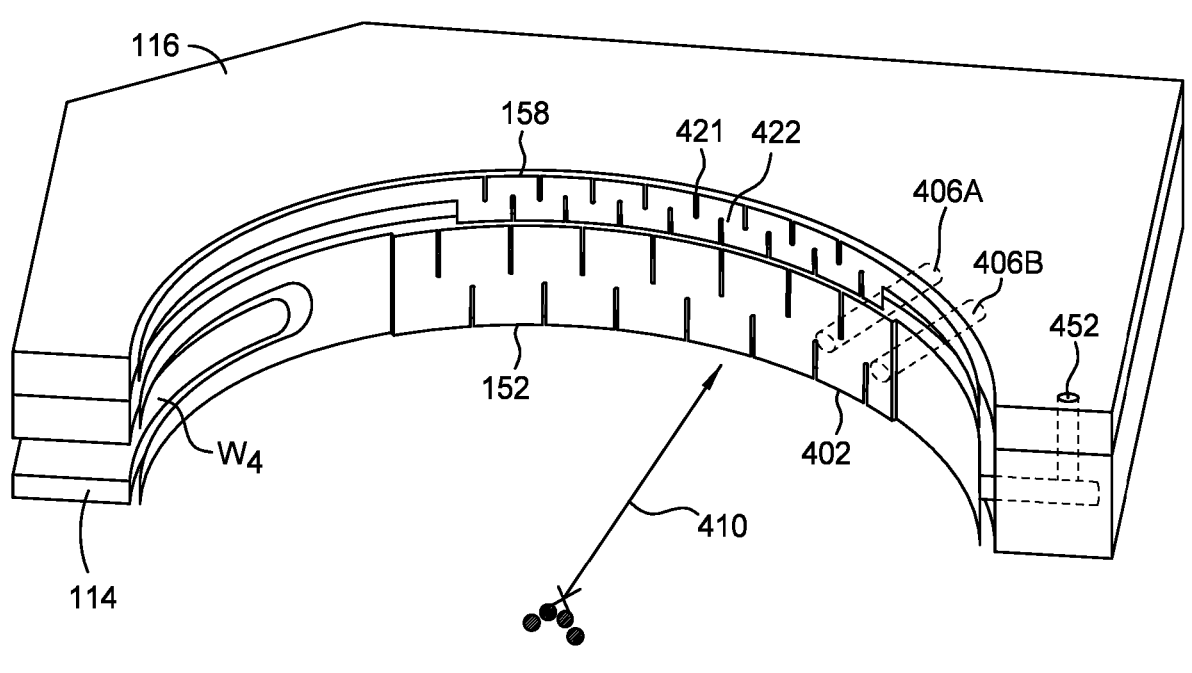
FIG. 4B is a schematic isometric sectional view of the heaters shown in FIG. 4A, according to embodiments of the present disclosure.

The lower heater 152 includes a substrate passage opening 404 disposed through the resistive heating element 402. The substrate passage opening 404 is configured to align with the substrate transfer passage 162. The substrate passage opening 404 is sized to allow a substrate, such as the substrate 150 depicted in FIG. 1, to pass therethrough. The width $W_8$ of the substrate passage opening 404 is about 305 mm to about 350 mm, such as about 305 mm to about 315 mm (FIG. 4B).

In one example, resistive heating element 402 has a ring shape. Within the ring shape, the resistive heating element 402 is disposed in a serpentine arrangement, such that the resistive heating element 402 includes a plurality of turns and bends. The resistive heating element 402 include vertical portions 411 disposed parallel with one another and horizontal portions 412 disposed parallel with one another.

The vertical portions 411 have a height 491. Each of the vertical portions 411 is connected at one end to the adjacent vertical portion 411 by one of the horizontal portions 412 and to the adjacent vertical portion 411 on the other side of the vertical portion 411 to another one of the horizontal portions 412 at the other end. Current from a power source (not shown) flows through the coils of the resistive heating element 402, i.e., a serpentine-shape resistive heating element, and resistively heats the resistive heating element 402.

In one example, the resistive heating element 402 is a carbon based material, such that the resistivity of the coil material is about 500 μΩ·cm to about 1500 μΩ·cm, such as about 750 μΩ·cm to about 1250 μΩ·cm. In some embodiments, the resistive heating element 402 is formed of a graphite material. Other materials which form the resistive heating element 402 may include paralytic graphite and silicon carbide. The paralytic graphite and silicon carbide may include alternative resistivity ranges. Gaps 408 are formed between each of the adjacent vertical portions 411. The gaps 408 enable thermal expansion of the resistive heating element 402 and may also allow purge gases or other gases to pass therethrough. The gaps 408 may be larger along the side of the resistive heating element 402 opposite the substrate passage opening 404 to allow exhaust gases, such as exhaust gasses to pass therethrough. Alternatively, an opening or a break in the resistive heating element 402 is disposed adjacent to the lower chamber exhaust passage 164. The exhaust gasses would pass through the gaps 408 and to the lower chamber exhaust passage 164 (FIG. 1).

The resistive heating element 402 has a curved or hollow cylindrical shape and is disposed between the lower liner 154 and the inner wall 404 of the base ring 114. The resistive heating element 402 forms at least a partial ring. In some examples, the resistive heating element 402 fully or partially encircles the internal volume 110 and the lower liner 154. Each coil 406 of the resistive heating element 402 includes two vertical portions 411 connected by a horizontal portion 412 at a first distal end of each vertical portion 411 and half of a horizontal portion 412 coupled to the opposite distal end of each of the vertical portions 411. There are a plurality of coils 406 disposed within the resistive heating element 402.

The upper heater 158 is disposed between an inner periphery of the inject ring 116 and an outer periphery of the upper liner 156. In one example, the upper heater 158 is spaced from the upper liner 156 while in contact with the injection ring 116. In another example, the upper heater 158 is spaced from both the upper liner 156 and the injection ring 116. The upper heater 158 may be formed from a resistive heating element 402 similar to the lower heater 152. For example, the upper heater 158 is disposed in a serpentine arrangement. The upper heater 158 includes vertical portions having a height 492. The vertical portions are disposed parallel with one another. In one example, the vertical portions all have the same heights 492. The upper heater 158 additionally includes horizontal portions having a width 426. The upper heater 158 additionally includes horizontal portions disposed parallel with one another. In one example, the horizontal portions all have the same width 426. However, it should be appreciated that the width 426 of the horizontal portions may not all be the same. Each of the vertical portions is connected at one end to the adjacent vertical portion by one of the horizontal portions and to the adjacent vertical portion on the other side of the vertical portion to another one of the horizontal portions at the other end to form the serpentine arrangement of the heating element 402.

In one example, the height 491 of the vertical portions 411 for the lower heater 152 is greater than the height 492 of the upper heater 158. However, it should be appreciated that the respective heights 491, 492 for the lower heaters 152 and upper heater 158 is defined by the chamber components.

FIG. 4B is a schematic plan isometric sectional of the heaters 152, 158 shown in FIG. 4A. The upper heater 158 and the lower heater 152 are shown partially assembled with base ring 114 and the injection ring 116. The partial assembly does not show the upper liner 156 or lower liner 154. The curvature of the upper heater 158 and the lower heater 152 forms an opening 410 disposed within internal volume 110 of the epitaxial chamber 100. The flange 160 is connected to the top end of the lower heater 152 and extends radially outward from the lower heater 152. The flange 160 may be configured to connect to or rest within a groove or divot of the base ring 114 of the inject ring 116. In some embodiments, the flange 160 may extend between the base ring 114 and the inject ring 116. The flange 160 has a flat ring shape.

The resistive heating element 402 of the lower heater 152 is electrically coupled to a first electrical connection 406a (Shown in FIG. 4A) and a second electrical connection 452. The first electrical connection 406a and the second electrical connection 452 are configured to be connected to a power source. The first electrical connection 406a and the second electrical connection 406b provide power to the resistive heating element 402 of the lower heater 152 so that the temperature of the lower heater 152 may be controlled. Similarly, the resistive heating element 402 of the upper heater 158 is electrically coupled to a first electrical connection 451A and a second electrical connection 451B. The first electrical connection 451A and the second electrical connection 451B are configured to be connected to a power source. The first electrical connection 451A and the second electrical connection 451B provide power to the resistive heating element 402 of the upper heater 158 so that the temperature of the upper heater 158 may be controlled.

Figure 5A:
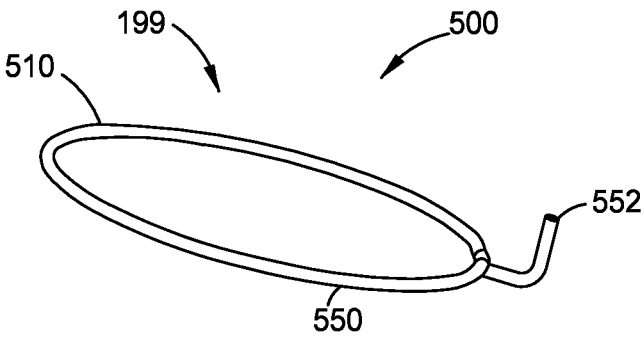
FIG. 5A is schematic cross sectional view for another embodiment of the lower heater, according to embodiments of the present disclosure.
Figure 5B:
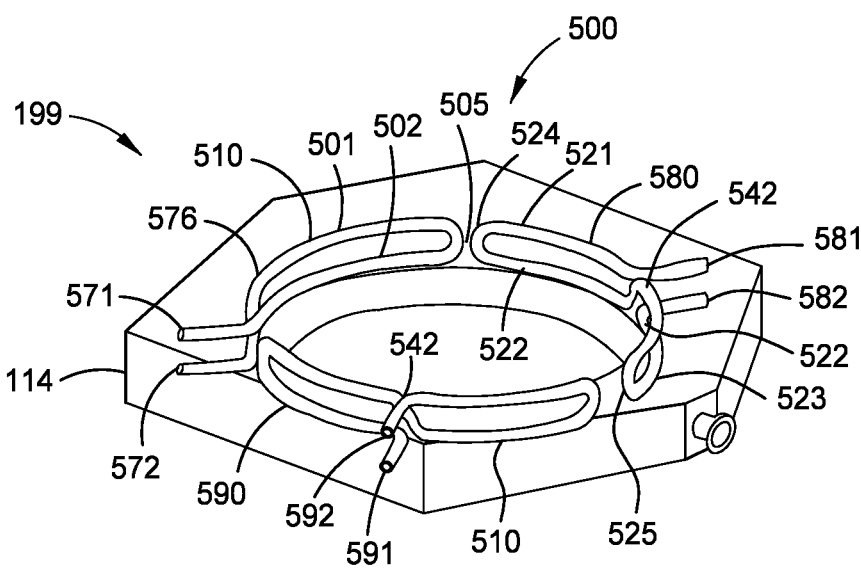
FIG. 5B is a schematic isometric view illustrating additional examples of the lower heater 152 of FIG. 5A.

FIG. 5A is schematic cross sectional view of the lower heater 152, according to a second embodiment 500 of the present disclosure. FIG. 5B is a schematic isometric view illustrating additional examples of the lower heater 152 of FIG. 5A. The heating elements of the lower heater 152 may be formed of tubing 510. In one example, the tubing 510 is a lamp, i.e., bulb, shaped into the tubes for controlling the surrounding temperature. The tubing 510 may be made from quartz, or other high temperature resistant transparent material. A filament, such as tungsten, is deposed in the tubing 510. The filament heats up and generates radiative heating in a manner similar to the lamps used in the upper and lower lamp modules. The lower heater 152 may be one or multiple curvilinear lamps that radiate heat to the chamber walls and/or chamber liners. In another example, the tubing 510 has a temperature controlled fluid running within the tubing 510 for controlling the surrounding temperature.

The tubing 510 of the lower heater 152 may have a first connection 551 and a second connection 552. The first connection 551 and second connection 552 may be electrical and provide power to the tubing for controlling the temperature of the lower heater 152. For example, the power supplied to first connection 551 and the second connection 552 may heat a tungsten filament in the tubing 510. In one example, the lower heater 152 is one continuous quartz tube 550 having a tungsten filament. It should be appreciated that the lower heater 152 may employ other methods for radiating heat. For example, the lower heater 152 may be a carbon based resistive coil, or a fluid.

In another example, the lower heater 152 may be formed from more than a single heating element, i.e., tubing 510 as shown in FIG. 5B. The lower heating element 152 may be formed from multiple tubes or such that there may be more than one first connections 551 and more than one second connections 552. For example, the first connections 551 and second connections 552 of the first tube 550 may be different than a third connection and fourth connection of a second tube. In such an example, each tube 550 of the lower heating 152 may be individually and independently controlled.

In yet another example, the lower heater 152 may be formed from three or more separate tubes 510. The lower heater 152 may have a first tube 570 having a first inlet connector 571 and a first outlet connector 572, a second tube 580 having a second inlet connector 581 and a second outlet connector 582, and a third tube 590 having a third inlet connector 591 and a third outlet connector 592. Flow of power through each of the first tube 570, second tube 580, and third tube 590 may be independently controlled, advantageously enabling greater control of localized temperatures along different regions of the inject ring 116 for better process control and uniformity.

In the examples cited above, the tubing 510 may have a cross over 542, or twist, to ensure the temperature output of the tubing 510 is consistent as the temperature of the fluid running inside the tubing 510 while negating the effects of thermal expansion of the tubing 510. For example, as shown in the second tube 580, the filament travels through the second inlet 581 before entering a first top portion 521 and a 90 degree bend 524 prior to heading back along a second lower portion 522. The filament disposed in the tube 510 along the second lower portion 522 enters the cross over 542 prior to entering the upper third portion 553 before a 90 degree bend 525 has the filament heading back along the lower fourth portion 554 and connecting to the second outlet connector 582 of the second tube 580. The serpentine path of the second tube 580 more evenly distributes the heat while allowing easy installation of the lower heater 152 while compensating for thermal expansion to prevent binding or breaking of the tube 510. In some locations, such as shown with the third tube 590 located around the slot for substrate transfer, the tubing 510 heating only have an upper portion 501 and a lower portion 502 connected by a 90 degree bend 503. However, it should be appreciated that the tubing 510 not incorporating the cross over 542 may be utilized throughout for the sake of simplicity where thermal expansion of the tubing 510 can be ignored, such as where the tubing 510 is undersized for the location.

Advantageously, the lower heater 152 configured with a tubing 510 allows the lower heater 152 to be easily integrated into the heating apparatus of the epitaxial chamber 100.

Figure 6B:
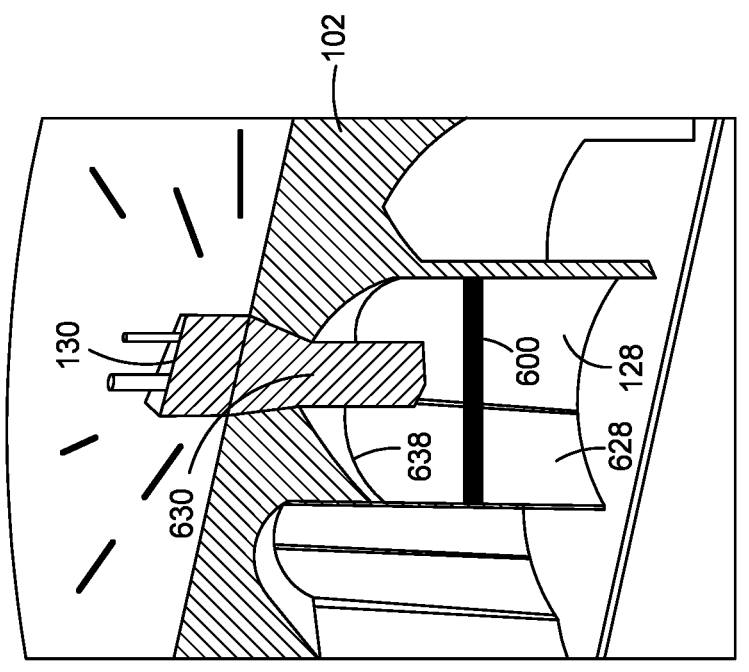
FIG. 6B is schematic view for another embodiment an optical filter.
Figure 6A:
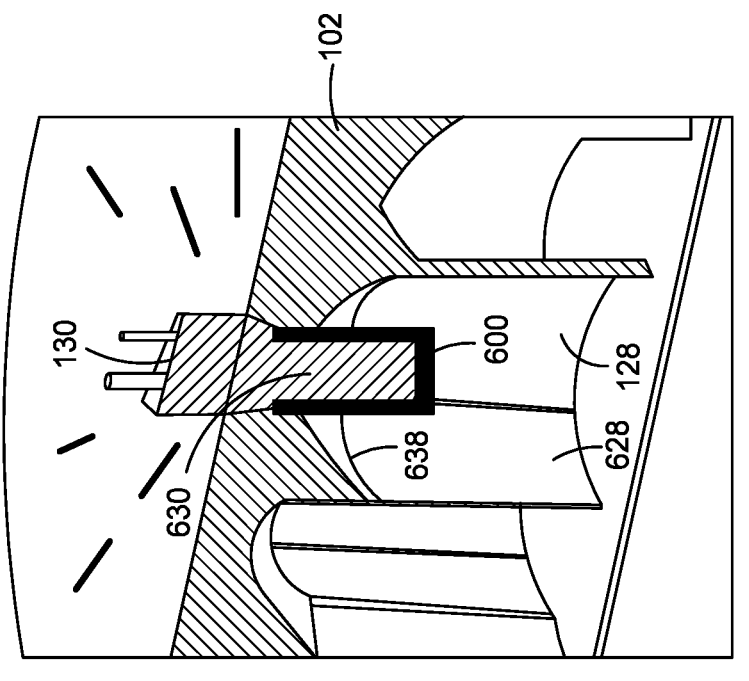
FIG. 6A is schematic view for one embodiment an optical filter.

FIGS. 6A and 6B illustrate two examples of optical filters 600 for the pyrometer passage 138/192. The optical filter 600 may be used in the upper dome 102 or the lower dome 104 to cover each pyrometer passage 138/192. The optical filter 600 filter select IR frequencies from the lamps 130 to improve the pyrometer measurements.

An IR pyrometer is used to measure temperature of the substrate in the epitaxy chamber 100. Typically a single wavelength (or "color") is picked to monitor the IR irradiation from the substrate by the pyrometer and convert that (along with knowledge of optical properties of the target) to temperature using Plank's law. Selection of the wavelength to monitor is such that it is not blocked by the upper window 122 or lower window 120. For example, for a quartz window (120,122), the wavelengths beyond 4 um would be filtered, therefore, wavelength detected by the pyrometer is less than this limit of 4 um. The lower the wavelength the higher resolution can be achieved in terms of IR signal detection, however, lower wavelength also means that the signal-to-noise ratio is weaker. Another complexity in temperature measuring in an epitaxy process chamber (temp as high as ~1200 C) is that signal received by the IR detector is a convoluted signal from both the target of interest and radiation from the heating filaments (in a lamp heating system). Thus, optical filers 600 are disclosed in the form of sleeves or flat plates of quartz, with proper OH content that filter the peak of a particular wavelength (for example 2.7 um) from spectrum. The selected wavelength can be used for pyrometer detection with minimal noise due to the irradiance from the lamps 130. Alternative implementation could be using quartz material with adjusted OH content (e.g., low OH, low Fe impurity quartz with ~5 mm thickness to fully block the unwanted emission) as the material for the lamp bulb filter 600. In one example, a low OH content Quartz is used to filter out 2.7 um to allow for good IR detection of the heat in the chamber.

The pyrometer passage 138 has an opening 626, sidewalls 628, and an upper wall 638. The upper wall 638 may be conical in shape and have an opening 630 in the center. The opening 630 is configured to allow the pyrometer 130 to extend through the upper wall 638 into the pyrometer passage 138.

In one example, the optical filter 600 has a cup shape lens and is coupled the upper wall 638 of the pyrometer passage 138. The optical filter 600 may screw into the upper wall 638. Alternately, optical filter 600 may have tangs which lock into openings formed in the upper wall 638. However, it should be appreciated that any manner of attachment of the optical filter 600 to the upper wall 638 is suitable where the optical filter 600 can screen out unwanted IR wavelengths.

In another example, the optical filter 600 has a flat shape and is coupled the sidewall 628 of the pyrometer passage 138. The optical filter 600 may be fastened to the sidewall 628. Alternately, optical filter 600 may have tangs that engage features extending from the sidewall 628, for example with a quarter turn. However, it should be appreciated that any suitable technique for coupling the optical filter 600 to the sidewall 628 may be utilized.

Advantageously, the optical filter 600 allows for more accurate detection of the temperature inside the epitaxial chamber 100 by filtering the lamp radiation for improved signal to noise ratio when monitoring the temperature. The optical filter 600 reduces interference of extraneous wavelengths for good IR detection of the temperature in the epitaxial chamber 100. The various temperature control elements 199 disclosed above permit decoupling of the temperature controls from the surrounding chamber components, which enable more rapid and reliable temperature control. Thus, the temperature control elements 199 provide improved methods for managing and maintaining a temperature profile of the substrate in concentrically divided zones, resulting in better quality films, more throughput and reduced service and cleaning burdens.

The components described herein allow greater uniformity and deposition control within a process chamber, such as the epitaxial chamber 100. Although illustrated together in one epitaxial chamber 100 herein, components described herein may be utilized separately with existing or alternative deposition process chambers.

While the foregoing is directed to embodiments of the present disclosure, other and further embodiments of the disclosure may be devised without departing from the basic scope thereof, and the scope thereof is determined by the claims that follow.

What is claimed is:

1. An epitaxial chamber comprising:
a chamber body assembly;
a lower window;
an upper window, wherein chamber body assembly, wherein the lower window and the upper window enclose an internal volume;
a susceptor assembly disposed in the internal volume; and
a plurality of temperature control elements comprising:
an upper lamp module comprising:
an upper module body with a top surface and a bottom surface;
a central axis;
a plurality of lamp apertures disposed from the bottom surface of the upper lamp module towards the top surface of the upper lamp module, the plurality of lamp apertures arranged in a first zone and a second zone, said first zone and said second zone are concentric, said second zone circumscribing the first zone and said second zone located further from the central axis than the first zone, the plurality of lamp apertures comprising:
a lamp base support;
a bulb opening at the bottom surface of the upper lamp module; and an axis of each lamp aperture defined by a centerline through the lamp base support and the bulb opening of each lamp aperture and disposed at an angle to the central axis, wherein a first angle to the central axis of a first axis of a first lamp aperture is not equal to a second angle to the central axis of a second axis of a second lamp aperture, and wherein the axis of each lamp aperture is configured to orient a bulb of each lamp aperture of the upper lamp module at an angle greater than 0 degrees and less than about 45 degrees with respect to the central axis, and that the axis of each lamp aperture in the second zone further from the central axis is at an angle greater than the axis of each lamp aperture in the first zone closer to the central axis;
wherein the top surface of the upper lamp module comprises:
a raised portion of the top surface of the upper lamp module disposed radially outward of the central axis and raised relative to an outer portion of the top surface in a vertical direction;
said outer portion located further from the central axis than the raised portion in a horizontal direction;
wherein the lamp apertures are disposed through the outer portion of the top surface of the upper lamp module and a heated gas passage extending from the top surface to the bottom surface of the upper module body in the vertical direction; said heated gas passage is disposed through the center of the upper module body; and the plurality of temperature control elements further comprising:
a lower lamp module comprising:
a lower module body with a top surface and a bottom surface;
the central axis;
a plurality of lamp apertures disposed from the bottom surface of the lower lamp module towards the top surface of the lower lamp module;
a plurality of lamp apertures comprising:
a lamp base support; and
a bulb opening at the bottom surface of the lower lamp module, wherein each lamp aperture is configured to orient a bulb of each lamp aperture of the lower lamp module at an angle between greater than 0 degrees with respect to the central axis and 45 degrees from the center axis.

2. The epitaxial chamber of claim 1, further comprising:
an upper liner disposed inside of the internal volume and adjacent to an inject ring; and
a lower liner disposed inside of the internal volume and adjacent to a base ring.

3. The epitaxial chamber of claims 2, wherein the plurality of temperature control elements further comprises:
a lower heater is disposed between the lower liner and the base ring.

4. The epitaxial chamber of claim 1, wherein the plurality of lamp apertures are disposed in three distinct zones, each zone comprising 5 to 10 lamp apertures.

5. The epitaxial chamber of claim 1 further comprising:
a dome heater coupled to the heated gas passage and configured to supply hot air into a plenum bounded in between the upper lamp module and the upper window.

6. The epitaxial chamber of claim 5 wherein the chamber body assembly further comprises:
a base ring;
an inject ring disposed on top of the base ring;
an upper heater disposed between an inner periphery of the inject ring and an outer periphery of an upper liner; and
a lower heater disposed between a lower liner and the base ring.

7. The epitaxial chamber of claim 1, wherein the top surface of the upper lamp module comprises:
the lamp apertures of the upper lamp module disposed through the outer portion of the top surface of the upper lamp module.

* * * * *